United States Patent
Tan et al.

(10) Patent No.: US 8,033,693 B2
(45) Date of Patent: Oct. 11, 2011

(54) LIGHTING STRUCTURE WITH MULTIPLE REFLECTIVE SURFACES

(75) Inventors: Chin Nyap Tan, Penang (MY); Siang Ling Oon, Penang (MY); Bit Tie Chan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 273 days.

(21) Appl. No.: 12/433,771

(22) Filed: Apr. 30, 2009

(65) Prior Publication Data
US 2010/0277925 A1 Nov. 4, 2010

(51) Int. Cl.
*F21V 7/00* (2006.01)
(52) U.S. Cl. ........ 362/347; 362/346; 362/800; 362/297; 362/311.02
(58) Field of Classification Search .............. 362/311.01, 362/311.02, 311.06, 341, 343, 346, 349, 362/296.01, 297, 300, 800
See application file for complete search history.

(56) References Cited

U.S. PATENT DOCUMENTS

| | | | | |
|---|---|---|---|---|
| 4,218,727 A | * | 8/1980 | Shemitz et al. | 362/297 |
| 4,231,050 A | * | 10/1980 | Casey et al. | 257/184 |
| 4,686,612 A | * | 8/1987 | Pringle et al. | 362/297 |
| 5,642,933 A | * | 7/1997 | Hitora | 362/243 |
| 6,951,415 B2 | * | 10/2005 | Amano et al. | 362/520 |
| 7,111,964 B2 | * | 9/2006 | Suehiro et al. | 362/328 |
| 7,178,958 B2 | * | 2/2007 | Matsumoto et al. | 362/517 |
| 7,178,960 B2 | * | 2/2007 | Ishida | 362/545 |
| 7,390,109 B2 | * | 6/2008 | Li et al. | 362/296.07 |
| 7,431,480 B2 | * | 10/2008 | Godo | 362/311.06 |
| 7,470,042 B2 | * | 12/2008 | Ayabe et al. | 362/297 |
| 7,572,654 B2 | * | 8/2009 | Chang | 438/29 |
| 7,591,567 B2 | * | 9/2009 | Wilcox et al. | 362/297 |
| 7,597,459 B2 | * | 10/2009 | Maeda et al. | 362/268 |
| 7,661,864 B2 | * | 2/2010 | Kohara et al. | 362/606 |
| 7,703,961 B2 | * | 4/2010 | Yatsuda et al. | 362/545 |
| 7,789,540 B2 | * | 9/2010 | Gordin et al. | 362/359 |
| 7,794,118 B2 | * | 9/2010 | Huang et al. | 362/336 |

* cited by examiner

*Primary Examiner* — Anabel Ton

(57) ABSTRACT

A system and method for lighting structure designs, for example LED packaging, reflector designs and optics in lighting fixture, has been illustrated. In one embodiment, the lighting structure has multiple reflective surfaces such that a first reflective surface and a second surface form a first angle less than 90 degree while the second surface and a third reflective surface forms a second angle of less than 270 degree. The method can be applied in both LEDs package designs and second level optical application designs of a light module.

20 Claims, 9 Drawing Sheets

US 8,033,693 B2

LIGHTING STRUCTURE WITH MULTIPLE REFLECTIVE SURFACES

BACKGROUND

Performance of Light Emitting Diodes (LEDs) has increased significantly over the last ten years following Haitz's Law who has predicted that LED brightness doubles every 18 to 24 months. LEDs with power efficiency exceeding incandescent lamps have been developed and are available in the market. Unlike fluorescent lights which contain mercury, LEDs are believed to be more environmentally friendly. LEDs may be used in both low power areas such as indicator lights for electronic devices and also high power applications such as flash lights, backlighting displays, electronic signs and signal displays. Today, many strobe lights found in cameras and flashlights use LEDs.

Although LEDs have many advantages, there are challenges in terms of designs and mass volume manufacturing. One drawback is that light efficiency and life span of LEDs depend on operating temperature. Therefore, heat dissipation becomes a consideration in LED package designs. A good LED package design will enable heat dissipation, which lowers junction temperature and increases efficiency. Another consideration is the viewing angle. Light generated by LEDs may not necessary be emitted at the desired angle. A reflector is needed to ensure that light emitted from an LED die is directed to a desired direction or angle. Another drawback of LEDs is process variation. Sophisticated controls steps in manufacturing at the expense of cost may be needed to reduce process variation. The discussions above are general considerations in LED designs. Depending on the application, certain aspects can be ignored whereas certain aspects will become more critical.

Although optic design is mainly done at the package level, work on additional secondary optics is still needed at the application level in certain situations. Examples of the secondary optics are additional external reflectors and lens that can be placed onto LEDs. When packaged LEDs do not meet the specific requirement at the application level, optic designers use additional reflectors to improve light mixing. Additional reflectors optimize the light extraction to a desired viewing angle. For example, a flashlight may only require the light to illuminate at certain angle but a packaged LED may produce light at wider angle. This gap is filled by the additional second level optics designs such as reflector cups.

SUMMARY

A lighting structure used in LED package designs, reflector designs, and light fixture secondary optics designs to direct or redirect light, is illustrated. In one embodiment, a lighting structure found in LED packaging is disclosed. The lighting structure comprises a first reflective surface, a second surface and a third reflective surface. The first reflective surface and the second surface are connected at a first degree less than 90 degree. The second surface and the third reflective surface are connected at a second angle of at least 270 degrees.

In another embodiment, a lighting device with a packaged LED and a light reflector is disclosed. The packaged LED has a first reflective surface whereas the light reflector has a second surface and a third reflective surface. The first reflective surface and the second surface are connected, forming a first angle less than 90 degree. The second surface and the third reflective surface are connected, forming a second angle of at least 270 degree.

A method of operating lighting device is disclosed. The method includes steps of providing a light source, providing a reflective element with a first reflective surface, a second surface and a third reflective surface, causing the light source to emit light and directing the light to the reflective element. The first reflective surface and the second surface are connected at a first degree less than 90 degree. The second surface and the third reflective surface being connected at a second angle of at least 270 degrees. The first and the third reflective surface direct light emitted from the light source in a forward direction. The second surface direct light emitted from the light source in a direction opposite to the forward direction.

Other aspects and advantages of the present invention will become apparent from the following detailed description, taken in conjunction with the accompanying drawings, illustrated by way of examples.

BRIEF DESCRIPTION OF THE DRAWINGS

Illustrative embodiments by way of example, not by way of limitation, are illustrated in the drawings, in which.

DETAILED DESCRIPTION

Figure 1:
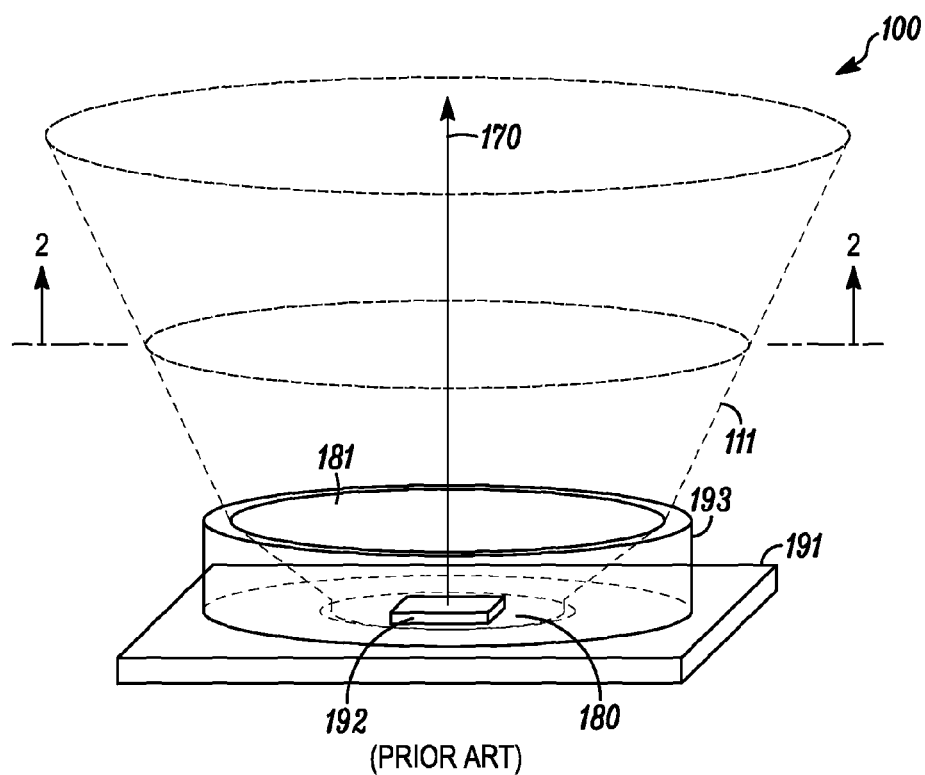
FIG. 1 illustrates a light output from an LED.

With reference to FIG. 1, a prior art top view LED lighting structure 100 comprises an LED die 192, a substrate 191 and an optical element 193. A portion of the substrate 191 which is highly reflective forms a lower reflective surface 180. The inner wall of the optical element 193 is usually coated with highly reflective material, forming a first reflective surface 181. The LED die 192, attached to the substrate 191 is operable to produce a light output 111. Optical element 193, lower reflective surface 180 and the first reflective surface 181 is operable to direct the light output 111 to a targeted direction. The targeted direction is defined as "forward direction". As illustrated in FIG. 1, the forward direction is top direction 170.

Figure 2:
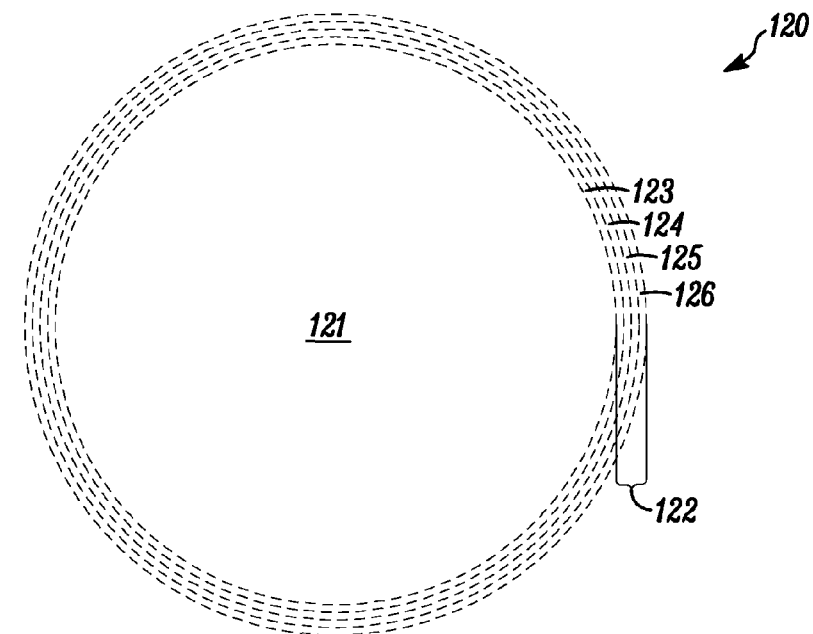
FIG. 2 illustrates a cross sectional view of the light output along section line 2-2 of FIG. 1.

FIG. 2 shows an example of cross sectional view 120 along section line 2-2 (See FIG. 1). In FIG. 2, the cross sectional view 120 at any surface planarly parallel to the substrate is substantially circular. Substantially circular shape may refer to any shape close to circular when viewed in cross section. The cross sectional view 120 in FIG. 2 shows that the substantially circular shape of the light output can be further divided into inner zone 121 and outer zone 122. Inner zone 121 is a more uniform light at inner portion of the circular shape. Outer zone 122 consists of multiple smaller annular rings 123-126 of light. Typically for white LEDs, the larger inner zone 121 is a uniform white light spot while outer zone 122 consists of annular yellow rings such as annular rings 123-126. These annular yellow rings are called "yellow ring effect".

Figure 3:
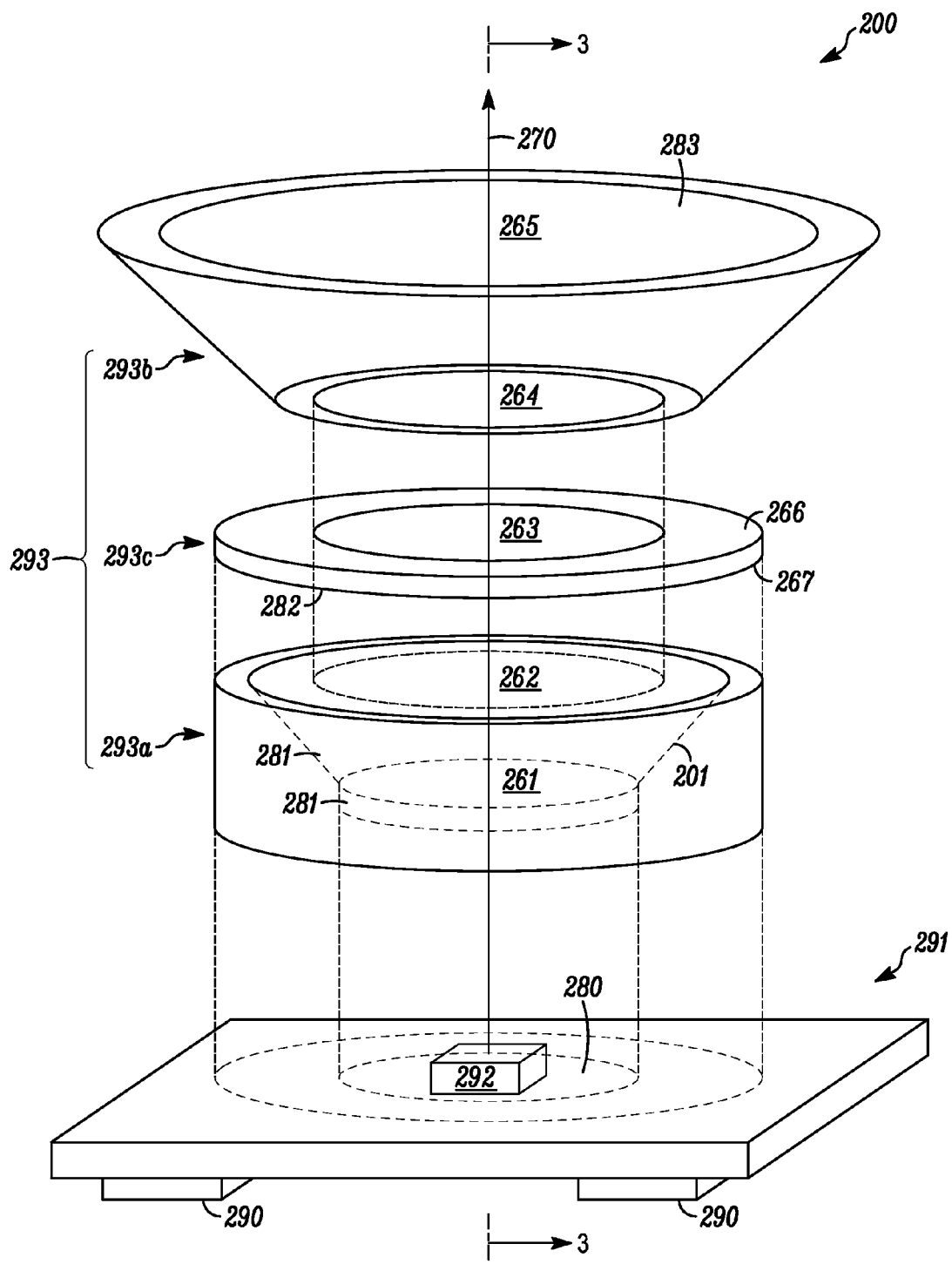
FIG. 3 illustrates one exploded view of an embodiment for top view LED design using 3 optical elements.

With reference to FIG. 3, an embodiment showing a lighting structure 200 for top view LEDs is described. The lighting structure 200 comprises a substrate 291, solder pads 290, an LED die 292, an optical element part 293 which further comprising a first optical element 293a, a second optical element 293c and a third optical element 293b. The LED die 292 is attached to the top surface of the substrate 291. A portion of the substrate 291 is coated with high reflective material such as metal or made from highly reflective material such as poly parabanic acid resin (referred to as "PPA" hereinafter) to form a lower reflective surface 280.

The first optical element 293a can be a cylindrical structure with inner conical shape wall 201 as illustrated in FIG. 3. The inner conical shape wall 201 may have a wider end 262 and a narrower end 261. The inner conical shape wall 201 can be coated with highly reflective material to increase reflectivity and defines a first reflective surface 281. The highly reflective material can be a metal such as aluminum and silver, or a non metallic type of material such as PPA. The wider end 262 of the conical shape wall is facing forward direction 270. The first optical element 293a is attached to the substrate 291 such that the narrower end 261 of the conical shape is attached to the substrate 291. The lower reflective surface 280 and the first reflective surface 281 form an angle, such as the third angle 253 (See FIG. 5) which is usually more than 45 degree. The third angle 253 can be selected such that the light emitted from the LED die 292 is redirected by both the lower reflective surface 280 and the first reflective surface 281 to the forward direction 270. Typically for top view LED designs, the third angle 253 can be more than 90 degree, but can be as low as 45 degree in side view LED designs (See FIG. 8).

Typically, the light produced by the LED die 292 is a single wave length monochromatic light. Even for white LEDs, the LED die 292 can be a blue color monochromatic light source. For white LEDs applications, phosphorus material may be needed to convert the monochromatic light to a broad spectrum light, i.e. blue color to white color. One method to implement the application of the phosphorus material is to dispense a first layer of pure silicon into the cup formed by the first reflective surface 281 to cover the LED die 292, followed by dispensing another layer of silicon-phosphorus material mixture onto the LED die 292. The thickness of each layer can be about 0.1 mm.

The second optical element 293c can be a thin ring plate structure with a top surface 266 and a bottom surface 267. The opening 263 at center portion of the second optical element 293c allows light to pass through. With reference to FIG. 3, the opening 263 of the second optical element 293c is smaller than the opening at the wider end 262 of the first optical element 293a. A portion of the bottom surface 267 may form a second surface 282. The bottom surface 267 of the second optical element 293c can be attached to the wider end 262 of the first optical element 293a, and are coaxially aligned therewith. The attachment can be done by using conventional method such as glue or ultrasonic welding. As a result of the attachment, the second surface 282 and the first reflective surface 281 are connected forming a first angle, such as first angle 251 (See FIG. 7A) that is less than 90 degree. Typically, the second optical element 293c can be implemented using a ring shape silver plate. Other material such as plastic or ceramic can also be used. The second surface 282 may have a lower level of reflectivity compared to the first reflective surface 281 without a coating of highly reflective material.

The third optical element 293b can be a shape which is similar to the first optical element 293a. The third optical element 293b has a high reflectivity inner wall forming the third reflective surface 283. High reflectivity is achieved through coating such as metallic material or PPA. The third optical element 293b has a wider end 265 and the narrower end 264. The center portion is open to allow light to pass through. The narrower end 264 of the third optical element 293b is attached to the top surface 266 of the second optical element 293c, and are coaxially aligned therewith. As a result of the attachment, the third reflective surface 283 and the second surface 282 are connected forming a second angle, such as second angle 252 (see FIG. 7A) of at least 270 degree. To accommodate the third optical element 293b, the opening 263 of the second optical element 293c can be at the same size or smaller than the narrower end 264 of the third optical element 293b.

FIG. 3 illustrates one embodiment of lighting structure design 200 with the optical elements parts 293 comprising three optical elements. Alternative lighting design embodiments can incorporate two or four optical elements depending on how the optical elements can be molded and attached together. For example, the second optical element 293c and the third optical element 293b can be implemented as one optical element forming a structure similar to that of the first optical element 293a.

Figure 4:
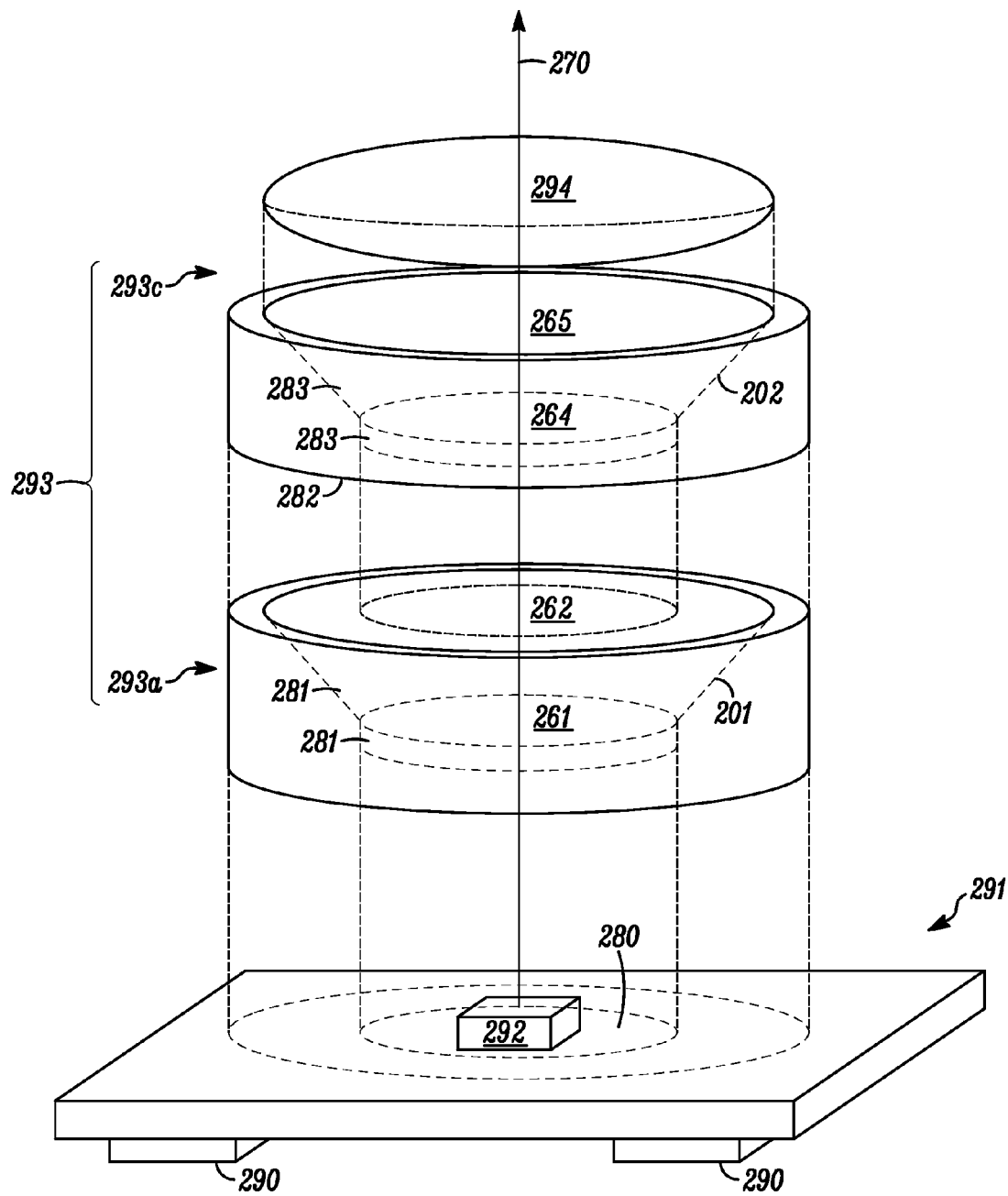
FIG. 4 illustrates one exploded view of an embodiment for top view LED design using 2 optical elements.

FIG. 4 illustrates one embodiment with optical element parts 293 comprising two optical elements. The designs of the first optical element 293a having inner conical shape wall 201 with a narrower end 261 and a wider end 262, the LED die 292, the solder pad 290, the substrate 291, the lower reflective surface 280 and the first reflective surface is similar to lighting structure 200 shown in FIG. 3. With reference to FIG. 4, the second optical element 293c can be cylindrical shape with a wider end 265 and a narrower end 264, which is similar to the first optical element 293a. The narrower end 264 of the second optical element 293c is smaller than the wider end 262 of the first optical element 293a. The narrower end 264 of second optical element 293c can be attached to the wider end 262 of the first optical element 293a, and coaxially aligned therewith. The second optical element 293c has an inner conical shape wall 202 forming the third reflective surface 283. The bottom portion of the second optical element 293c forms the second surface 282. An optical lens 294 can be attached to the wider end of the third optical element 293b such that a portion of the lens 294 abuts the third reflective surface 283 and the plane of the lens 294 is perpendicular to the light output direction, which has been defined as the forward direction 270.

Figure 5:
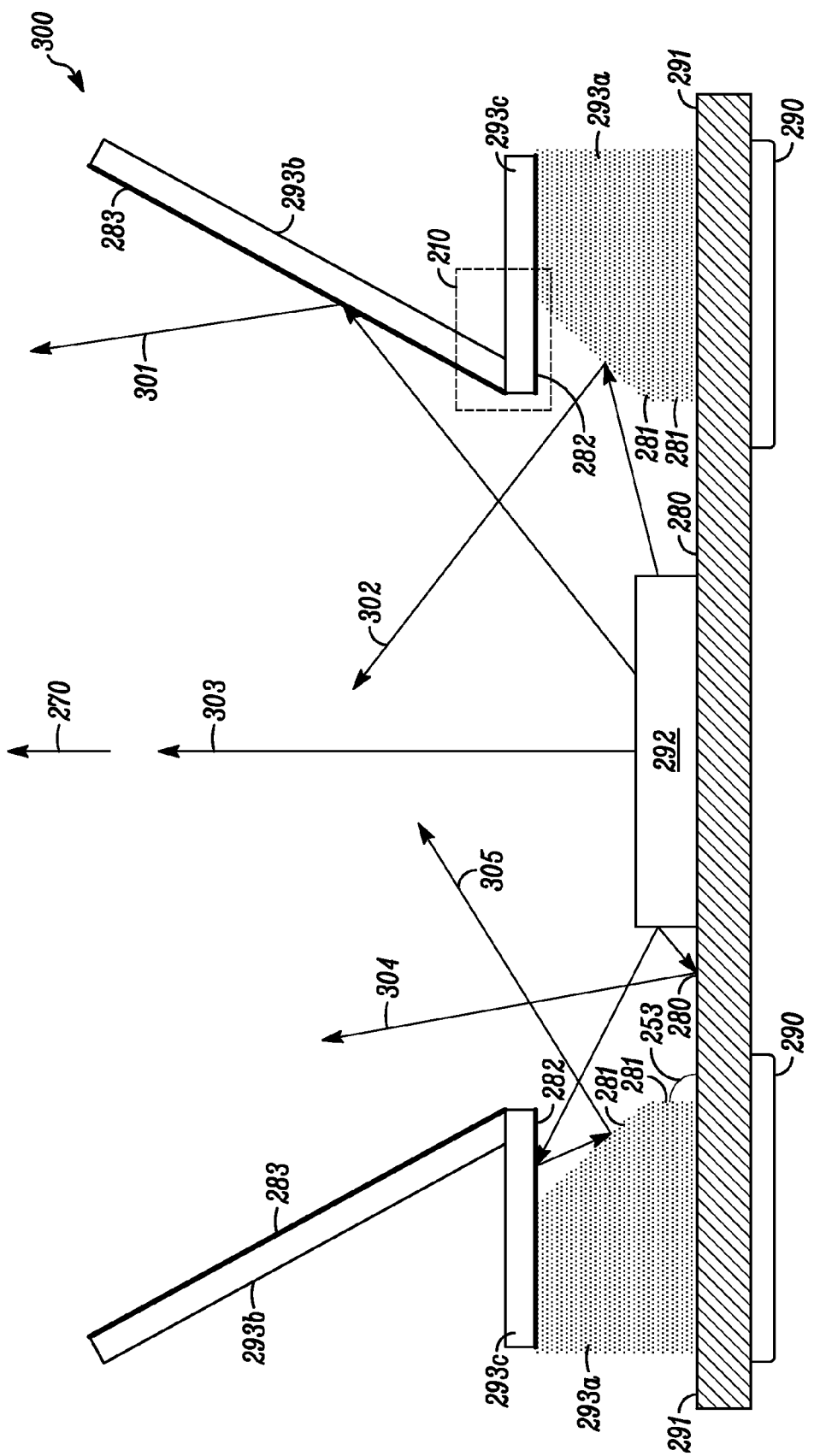
FIG. 5 illustrates light reflected by each reflective surface.

FIG. 5 shows a cross sectional view 300 taking along section line 3-3 (See FIG. 3) of the lighting structure 200. The cross sectional view 300 shows solder pads 290, the substrate 291, the LED die 292 and the three optical elements 293a-293c of the lighting structure 200. As the first optical element 293a is attached to the substrate 291, the lower reflective surface 280 and the first reflective surface 281 form a third angle 253. The third angle 253 is configured such that both the lower reflective surface 280 and the first reflective surface 281 are capable to direct light emitted form the LED die 292 towards the forward direction 270. Typically, the third angle 253 may be at least 45 degree depending on the forward direction 270 as discussed in earlier.

The embodiment in FIG. 5 illustrates how each reflective surface such as the lower reflective surface 280, the first reflective surface 281, the second surface 282 and the third reflective surface 283, is operable to direct light output from the LED die 292 to the forward direction 270. As illustrated in FIG. 5, the LED dice 292 is a light source operable to produce light output such as ray 301, ray 302, ray 303, ray 304 and ray 305. Cross sectional view of the light output, viewed at any surface planarly parallel to the substrate is substantially circular. This is similar to the cross sectional view 120 (See FIG. 2). A portion of light output is illustrated by ray 304. Ray 304 generated from the LED die 292, hit the lower reflective surface 280 and reflected towards forward direction.

Other portions of light generated from the LED die 292 are illustrated by ray 303, ray 302, ray 301 and ray 305. Ray 303 travels directly to the forward direction 270 without being reflected. Ray 302 may hit the first reflective surface 281 and reflected to forward direction 270. Ray 301 may hit the third reflective surface 282 and reflected to forward direction 270. However, considering the LED die 292 sitting in the middle of the cup, ray 305 at outer axis will hit the second surface 282 and being diffused back to the first reflective surface 281. For example, when ray 305 is reflected by the second surface 282, ray 305 is travelling at a direction opposite to the forward direction 270 towards the first reflective surface 281. Ray 305 is then further redirected in the forward direction 270 by the first reflective surface 281.

The lower reflective surface 280, the first reflective surface 281 and the third reflective surface 283 can be operable to direct light from LED die 292 in the forward direction 270 while the second surface 282 can be operable to direct light from LED die 292 in a direction opposite to the forward direction 270. The first reflective surface 281 and the third reflective surface 283 can be coated with high reflectivity material to maximize light output. Typically, reflectivity of the first surface 281 and the third surface 283 can be higher than 90%. To reduce cost, the second surface 282 may be left uncoated as one purpose of the second surface 282 is to block the light. In this case, the second surface 282 has lower level of reflectivity which is typically less than 90%. Another approach is to implement the second optical element 293c as a silver plate. Silver plate has a metal surface with high reflectivity, which is more than 90%.

As discussed in the description of FIG. 1, for any conventional LED devices with single reflector cup, the undesired annular rings 123-126 (See FIG. 2) would occur at outer zone 122 (See FIG. 2). As illustrated in FIG. 5, lighting structure 200 is operable to block ray 305 responsible for majority of the outer annular ring, and then diffuse ray 305 back to the first reflective surface 281 and lower reflective surface 280 to mix the light before being redirected to the forward direction 270. The lighting structure 200 shown in FIG. 3 is operable to eliminate the outer annular ring producing a uniform light. One design parameter to obtain this result is through careful designing of the first angle 251 formed between the first reflective surface 281 and second surface 282, as well as the second angle 252 formed between the second surface 282 and the third reflective surface 283. Adjusting the first angle 251 and the second angle 252 will affect amount of light being diffused at the outer ring. In certain occasion, the first angle 251 and second angle 252 may be selected using optical simulation tools to obtain output without yellow ring.

Figure 6A:
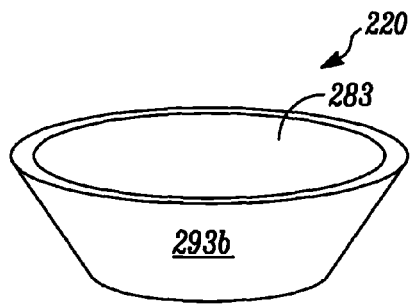
FIG. 6 illustrate alternate embodiments of the third optical elements.
Figure 6B:
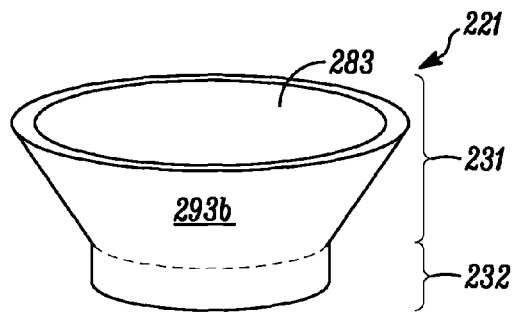
Figure 6C:
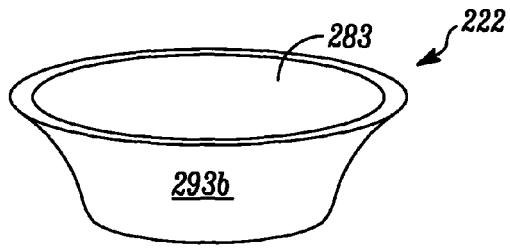
Figure 7A:
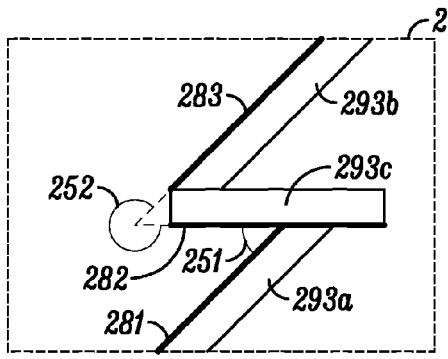
FIG. 7 illustrate the relation between three reflective surfaces in the lighting structure.
Figure 7B:
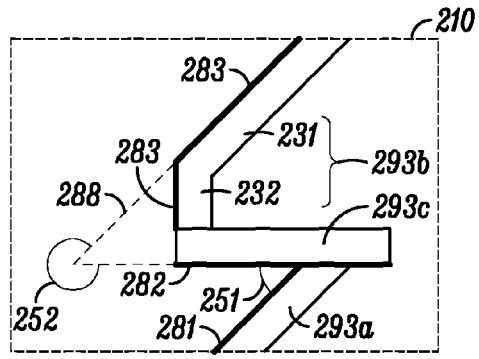

FIG. 6A-FIG. 6C show various alternate designs 220-222 of the third optical element 293b. All the alternate designs 220-222 have an inner wall forming the third reflective surface 283. FIG. 7A shows a portion of cross sectional view 210 (See FIG. 5) taking along section line 3-3 of FIG. 3 to illustrate the relationship between the first reflective surface 281, the second surface 282 and the third reflective surface 283. FIG. 7B shows the cross sectional view 210 when the third optical element 293c shown in FIG. 6B is used, but the first optical element 293a and the second optical element 293c remain unchanged. Similarly, FIG. 7C shows the cross sectional view 210 when the third optical element 293c shown in FIG. 6C is used while the first optical element 293a and the second optical element 293c remain unchanged.

As discussed in earlier paragraph, FIG. 7A shows that the first reflective surface 281 and the second surface 282 are connected to form a first angle 251. The first angle 251 and the second angle 252 may be selected with two considerations. First, light output emitted from LED die 292 must be redirected to the forward direction 270. For example, ray 302 (See FIG. 5) when striking at the first reflective surface 281 should be reflected towards the forward direction 270. Similarly, ray 301 (See FIG. 5) when striking at the third reflective surface 283 should be reflected towards the forward direction 270. Second, ray 305 (See FIG. 5) when striking the second surface 282 should be either absorbed, or reflected to the lower reflective surface 280 or the first reflective surface 281. In the current embodiment, the first angle 251 is preferably less than 90 degree and the second angle 252 is preferably more than 270 degree.

Figure 7C:
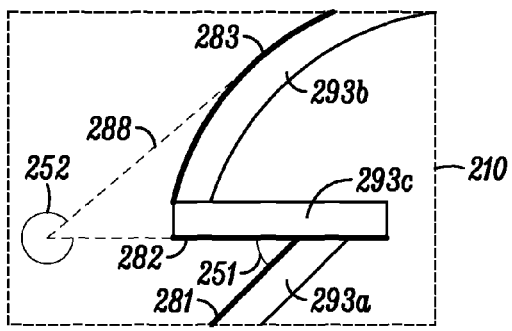

In embodiments shown in FIG. 7B and FIG. 7C, cross sectional view of the third reflective surface 283 is not a straight line and a "most representative line approach" should be used to define the first angle 251 and the second angle 252. The most representative line approach can be done by drawing a virtual line to represent a cross sectional view of a surface which is not a straight line.

With reference to FIG. 6B, an alternate design 221 of the third optical element 293b having an "elevated conical shape" is shown. The "elevated conical" shape has a conical portion 231 and a small cylindrical portion 232. The conical portion 231 forms the majority portion and is larger than the small cylindrical portion 232. Referring to FIG. 7B that shows the corresponding cross sectional view 210. A most representative line 288 can be drawn considering only the substantial portion of the third reflective surface 283 at the conical portion 231. In the most representative line approach, the conical portion 231 will be taken into consideration and the small cylindrical portion 232 will be omitted when defining the second angle 252.

FIG. 6C shows another alternate design 222 of the third optical element 293b having a curve surface. In FIG. 7C, the curvature of the sectional view of the third reflective surface 283 is not a straight line. Using the most representative line approach, a representative straight line 288 can be drawn. The representative line 288 gives the best proximate of first order measurement. In this case, the angle forms by the third reflective surface 283 and the second surface 282 is as defined by second angle 252 using the representative line 288. The most representative approach described is also applicable to the second surface 282 and the first reflective surface 281 to define the first angle 251.

Figure 8:
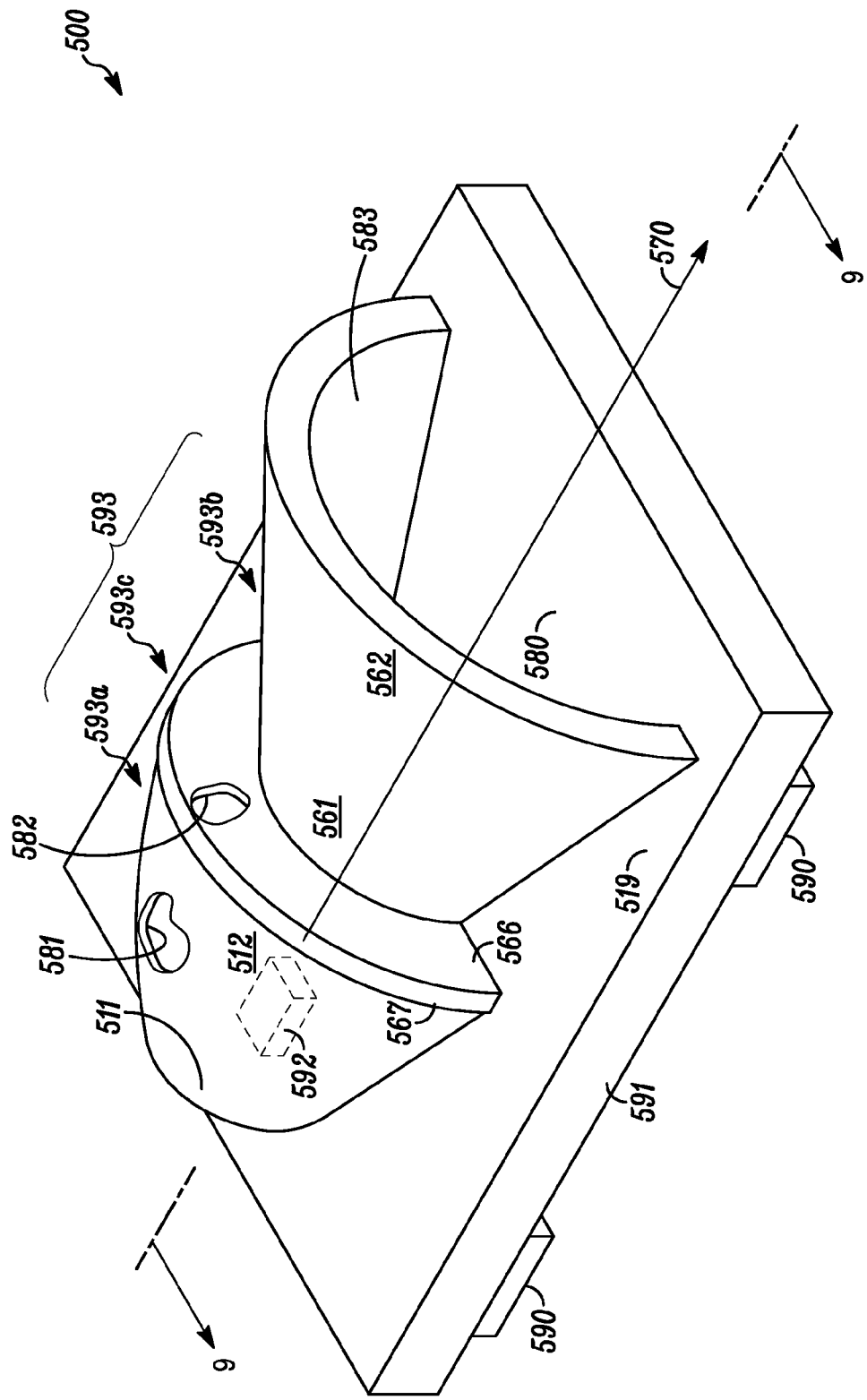
FIG. 8 illustrates one embodiment for a side view LED design.

FIG. 8 shows an embodiment of a lighting structure 500 for side view LEDs is presented. The lighting structure 500 comprises solder pads 590, a substrate 591, an LED die 592, an optical element part 593 which further comprising a first optical element 593a, a second optical element 593c and a third optical element 593b. The LED die 592 is attached to top surface 519 of the substrate 591. A portion of the substrate 591 forms a lower reflective surface 580. The first optical element 593a is operable to redirect light generated from the LED die 592 to the forward direction 570. The first optical element 593a may define a concave shape or semi-parabolic shape. In FIG. 8, the first optical element 593a defines a semi-parabolic shape structure. The axis of the optical element 593a can be positioned parallel to the plane of the substrate 591, with a vertex 511 at one end and a wider end 512 at another end. The first optical element 593a can be attached to the substrate 591 such that the axis of the semi-parabolic is parallel to the plane of the substrate 591. The inner wall of the first optical element 593a defines the first reflective surface 581. The first reflective surface 581 and the lower reflective surface 580 form an angle, for example, the third angle 553 (See FIG. 9) which may be at least 45 degree.

The second optical element 593c in FIG. 8 has similar functionality as the second optical element 293c shown in FIG. 3. The second optical element 593c may define a thin semi-ring shape optical structure with a top surface 566 and a bottom surface 567. The second surface 582 may be formed by a portion of the bottom surface 567. In FIG. 8, the plane of the semi-ring shape is positioned perpendicular to the plane of the substrate 591. The second optical element 593c is further attached onto the substrate 591 such that the bottom surface 567 of the second optical element 593c is connected to the wider end 512 of the first optical element 593a.

The third optical element 593b in FIG. 8 has similar functionality as the third optical element 293c shown in FIG. 3. The third optical element 593b may define a semi-conical shape optical structure with a narrower end 561 and a wider end 562. In FIG. 8, the third element 593b is positioned such that axis formed between wider end 562 and narrower end 561 is parallel to the plane of the substrate 591. The third optical element 593b is further attached onto the substrate 591 such that the narrower end 561 is connected to the top surface 566 of the optical element 593c. The inner surface of the third optical element 593c defines the third reflective surface 583.

Figure 9:
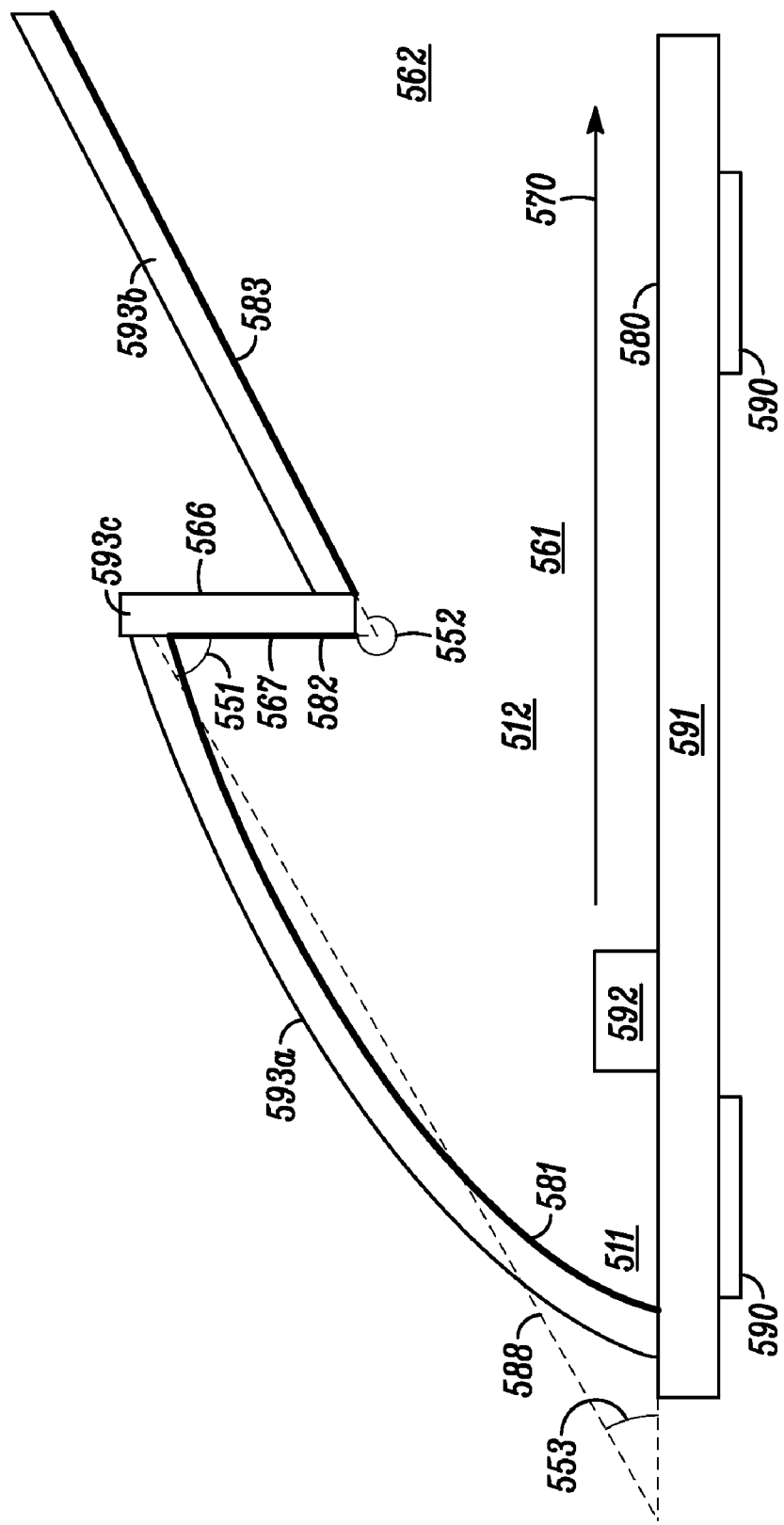
FIG. 9 illustrates cross sectional view of the side view LED along section line 9-9.

Typically the lower reflective surface 580, the first reflective surface 581 and the third reflective surface 583 are coated with reflective material. The lighting structure 500 may be operable to produce light to a predefined forward direction 570. FIG. 9 shows a cross sectional view taking along section line 9-9 (See FIG. 8) of the lighting structure 500. The first reflective surface 581 and the third reflective surface 583 may be operable to direct light emitted from LED die 592 more towards to the forward direction 570. However, the second surface 582 is capable to direct light generated from LED die 591 more towards an opposite direction to the forward direction 570.

With reference to FIG. 9, the first reflective surface 581 and the second surface 582 form at a first angle 551 whereas the second surface 582 and the third reflective surface 583 form a second angle 552. Section view of the first reflective surface 581 may not be straight line but a curve, such as a parabolic curve. The curve can be represented using a representative line 588 to define the first angle 551. The representative line 588 forms a first angle 551 which may be less than 90 degree. Similarly, the representative line 588 can be used to define the third angle 553 formed by first reflective surface 581 and the lower reflective surface 580. In FIG. 9, the third angle may be at least 45 degree. The second angle 552 may be larger than 270 degree.

Figure 10:
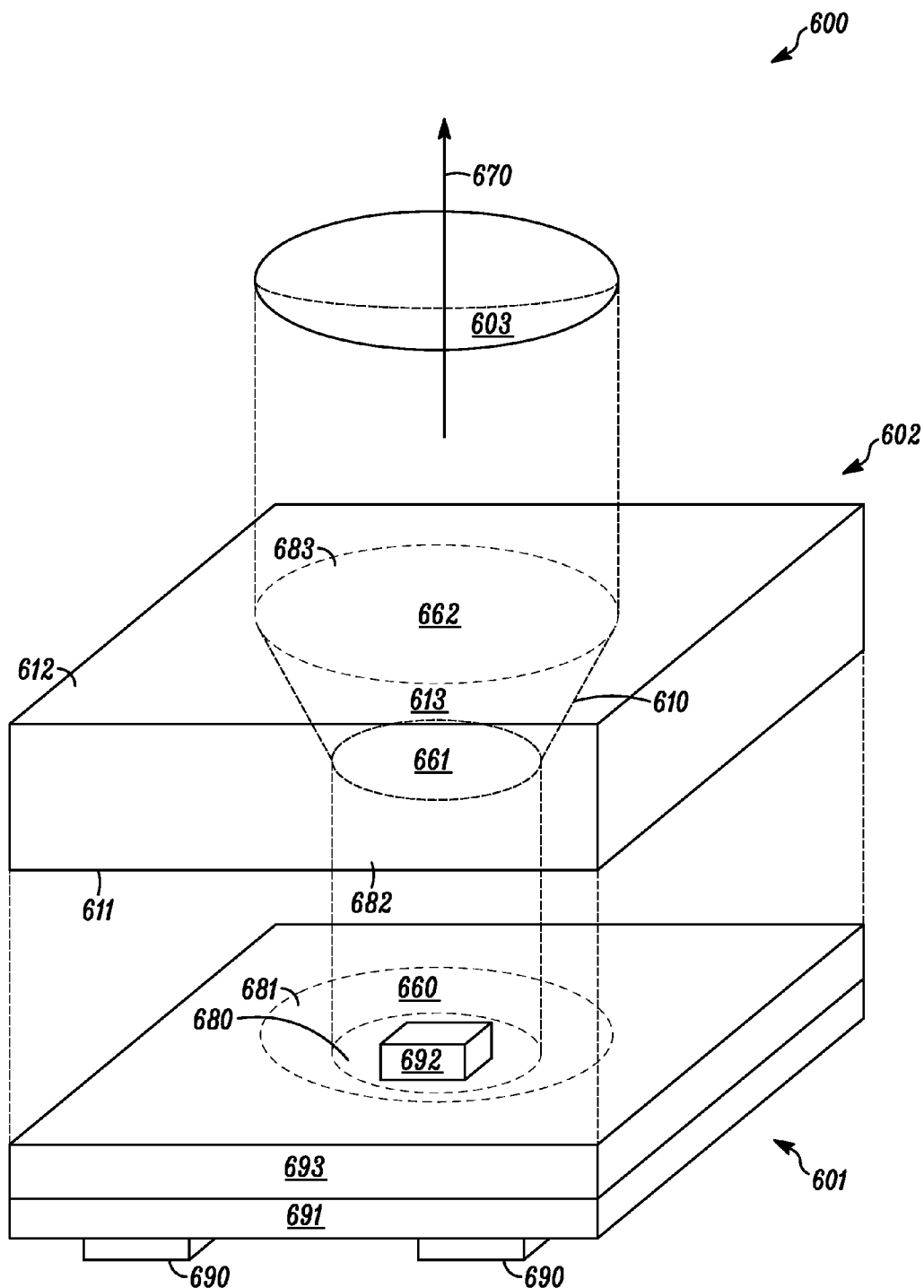
FIG. 10 illustrates one embodiment of a lighting device with secondary optics on a packaged LED.

All previous embodiments shown in FIG. 3 and FIG. 8 are examples of the lighting structure applied in LED light source packaging. However, one benefits of the lighting structure design shown in previous embodiments can be applied beyond packaging level. An embodiment showing how lighting structure designs can be implemented using secondary optics is illustrated in FIG. 10. System design engineers for electronics product usually purchased packaged LEDs and they do not have flexibility to alter the light source package designs to suite their needs. Usually, system design engineers use secondary optics such as additional reflectors and lens to meet their designs needs.

FIG. 10 shows a light device 600 which comprises a light reflector 602, a lens 603 and a packaged LED 601 which further comprising LED die 692, solder pads 690, a substrate 691 and optical elements part 693. The packaged LED 601 may be operable to produce light output. In FIG. 10, the top portion of the packaged LED 601 has an opening 660. The packaged LED 601 has a first reflective surface 681 and a lower reflective surface 680. The LED die 692 may be covered with an epoxy material. Without secondary optics, yellow ring effect may be observed at outer zone similar to the discussion in FIG. 2.

The light reflector 602 is a secondary optics designed for use with the packaged LED 601 to achieve specific optical results. The center portion 613 of the light reflector may be hollow with a larger opening 662 at the top portion 612 and a smaller opening 661 at the bottom portion 611. The bottom portion 611 of the light reflector 602 defines a second surface 682. The inner wall 610 of the light reflector 602 defines a third reflective surface 683. The third reflective surface 683 may define a conical shape.

The light reflector 602 can be a secondary optics element designed to snap fit onto the packaged LED 601 such that the smaller opening 661 is coaxially aligned to the opening of the packaged LED 660. When the light reflector 602 is snap fit onto the packaged LED 601, the second surface 682 may be connected to the first reflective surface 681 at the packaged LED 601 such that the two surfaces form a first angle of less than 90 degree. The second surface 682 and the third reflective surface 683 form a second angle of at least 270 degree. Depending on the designs needs, a lens 603 can be attached to the larger opening 662 of the light reflector 602 such that a portion of the lens 603 abut the third reflective surface 683 and the plane of the lens 603 is substantially perpendicular to the forward direction 670.

With reference to FIG. 10, the forward direction 670 is top direction. As the bottom opening 661 of the light reflector 602 may be smaller than the opening 660 of the LED 601, a portion of the light will be diffused by the second surface 682 of the light reflector 602. In this case, when the light hit the second surface 682 of the light reflector, the light will be absorbed or diffused by being reflected back to the lower reflective surface 680 and the first reflective surface 681.

Figure 11:
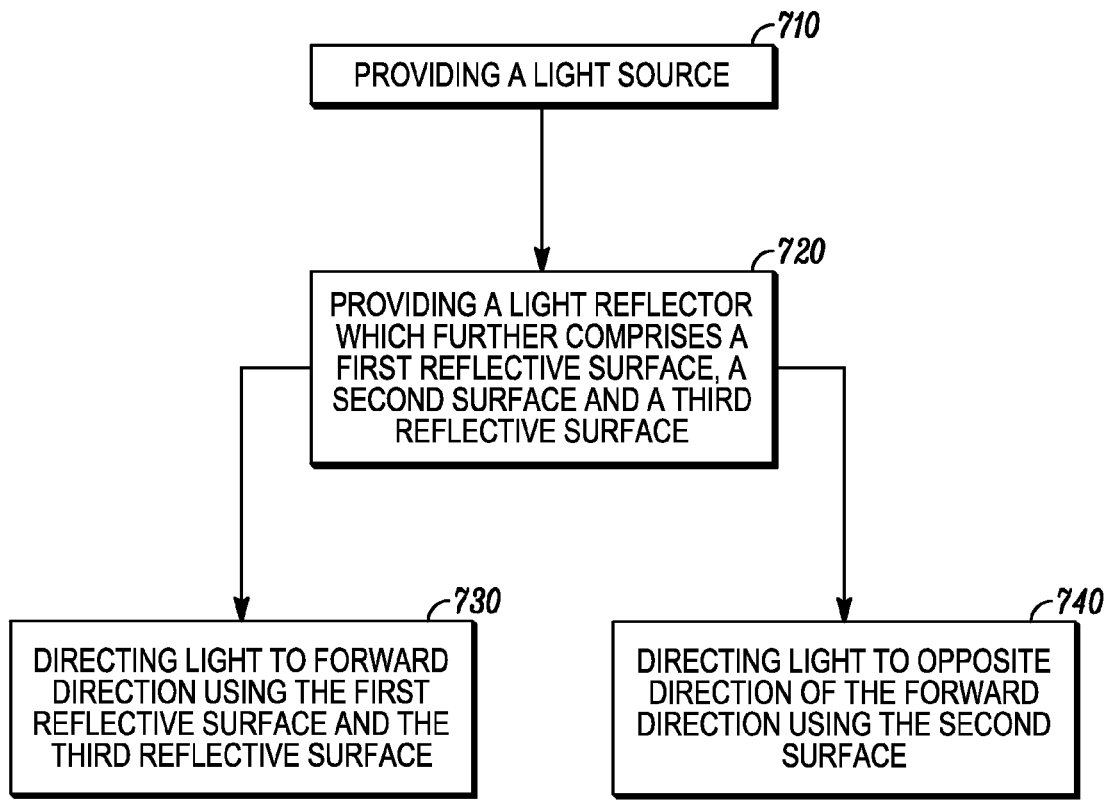
FIG. 11 illustrates a flow chart showing a method of operating a lighting device.

FIG. 11 shows a flow chart illustrating a method of operating a lighting device. In step 710, a light source is provided. In step 720, at least one reflector is provided. Collectively, the at least one reflector comprises at least three surfaces including a first reflective surface, a second surface and a third reflective surface. The first reflective surface and the second surface form a first angle, such as the first angle 251 (See FIG. 7A) which may be less than 90 degree. On the other hand, the second surface and the third surface form a second angle, such as the second angle 252 (See FIG. 7A) which may be at least 270 degree. In step 730, light emitted from the light source is being directed to the forward direction using the first reflective surface and the third reflective surface. In step 740, light emitted from the light source is being directed to opposite direction of forward direction using second surface. Examples of the first reflective surface, the second surface, the third reflective surface can be found in FIG. 3, FIG. 8 and FIG. 10.

One point to note is designs of lighting structures and lighting devices discussed above are not limited to a specific light source. A reflector designs developed for LED light source may be applicable to those of other light source technology or other future light source technology. For example, some designs of reflector cup used for incandescent light bulb in flashlight application have proven to work well using LED lamps replacing incandescent light, even though the designs of reflector cup did not take LED lamps in consideration. There are reported occasions that designers just replace light source, from incandescent light bulb to LED without changing anything on the secondary optics.

Although specific embodiments of the invention have been described and illustrated, the invention is not to be limited to the specific forms or arrangements of parts so described and illustrated. It is understood that the illustration and description shall not be interpreted narrowly. For example, although Light Emitting Diode (LED) is used in many embodiments, it is understood that proposed invention can be applicable to other light source technology. Similarly, a description of "two parallel surfaces" also includes "two surfaces which is substantially parallel". The scope of the invention is to be defined by the claims appended hereto and their equivalents.

What is claimed is:

1. A lighting structure comprising:
   a substrate, the substrate having a top and bottom surfaces;
   an LED, the LED being attached to the top surface;
   a first reflective surface;
   a second surface;
   a third reflective surface;
   a first angle of less than 90 degrees formed by the first reflective surface and the second surface being connected at said first angle; and
   a second angle of at least 270 degrees formed by the second surface and the third reflective surface being connected at said second angle;
   wherein the first and the third reflective surfaces are configured to direct light from the LED to a substantially forward direction; and
   wherein the second reflective surface is configured to direct light from the LED in a direction substantially opposite to the forward direction.

2. The lighting structure of claim 1, further comprising a third angle of at least 45 degrees formed by the top surface and the first reflective surface being joined at said third angle.

3. The lighting structure of claim 2, whereby the lighting structure is operable to output light in a substantially circular shape when the light is viewed in cross section.

4. The lighting structure of claim 2, further comprises a phosphorus material.

5. The lighting structure of claim 2, whereby the first angle and the second angle is determined using a most representative approach.

6. The lighting structure of claim 2, further comprising a lens, a portion of the lens abuts the third reflective surface and the lens has a plane perpendicular to the forward direction.

7. The lighting structure of claim 2, further comprises
   a first optical element, the first optical element defines a conical shape with a narrower end and a wider end, the first optical element has an inner wall , the inner wall of the first optical element defines the first reflective surface, the narrower end of the first optical element is attached to the top surface of the substrate;
   a second optical element, the second optical element defines a ring shape with a top surface and a bottom surface, a portion of the bottom surface defines the second surface, the bottom surface of the second optical element is attached to the wider end of the first optical element, and
   a third optical element, the third optical element defines a conical shape with a narrower end and a wider end, the third optical element has an inner wall, the inner wall of the third optical element defines the third reflective surface, the narrower end of the third optical element is attached to the top surface of the second ring shape optical element.

8. The lighting structure of claim 2, further comprises
   a first optical element, the first optical element defines a concave shape with a vertex at one end and a wider end at another end, the first optical element is position such that the axis formed between the vertex and the wider end is parallel to the substrate and attached thereon, the first optical element has an inner wall, the inner wall of the first optical element defines the first reflective surface;
   a second optical element, the second optical element defines a semi-ring shape having a top surface and a bottom surface, the second optical element has a plane perpendicular to the substrate and attached to the substrate thereon such that the bottom surface is connected to the wider opening of the first optical element; and
   a third optical element, the third optical element defines a semi-conical shape with a narrower end and a wider end, the third optical element is positioned such that the axis formed between the narrower and the wider end is parallel to the substrate and attached thereon such that the narrower end of the third optical element is connected to the top surface of the second optical element, the third optical element has an inner wall, the inner wall of the third optical element defines the third reflective surface.

9. The lighting structure of claim 1, wherein the second surface has at least the same level of reflectivity as the first and the third reflective surface.

10. The lighting structure of claim 9, wherein the second surface is metal.

11. The lighting structure of claim 1, wherein a portion of the light from the LED forms a yellow ring, and wherein each of the first angle and the second angle is selected to reduce the yellow ring otherwise emitted from the lighting structure.

12. A lighting device, comprising:
    a packaged LED operable to produce light;
    a first reflective surface, wherein the first reflective surface defines a portion of the package LED;
    a light reflector, further comprising,
    a second reflective surface;
    a third reflective surface;
    a first angle of less than 90 degrees formed by the first reflective surface and the second surface being connected at said first angle; and
    a second angle of at least 270 degrees formed by the second surface and the third reflective surface being connected at said second angle;
    wherein the first and the third reflective surfaces are configured to direct light from the packaged LED to a substantially forward direction; and
    wherein the second reflective surface is configured to direct light from the packaged LED in a direction substantially opposite to the forward direction.

13. The lighting device of claim 12, further comprises a substrate, the substrate having a top and bottom surface, and the top surface is adapted to accommodate the packaged LED.

14. The lighting device of claim 12, further comprising a lens, the lens is attached to the light reflector such that a portion of the lens abuts the third reflective surface and the lens has a plane perpendicular to the forward direction.

15. The lighting device of claim 12, wherein the light reflector is conical, the narrower end of the conical light reflector is attached to the packaged LED.

16. The lighting device of claim 12, whereby the lighting device forms a portion of a flash light.

17. The lighting device of claim 12, whereby the lighting device forms a portion of a flash for a camera module.

18. A method of operating a lighting device, comprising:
providing a light source;
providing at least one light reflector, the at least one light reflector further comprises a first reflective surface, a second surface and a third reflective surface;
causing the light source to emit light;
directing light emitted from the light source in a forward direction using the first reflective surface and the third reflective surface;
directing light emitted from the light source in a direction opposite to the forward direction using the second reflective surface;
wherein the first reflective surface and the second surface form a first angle less than 90 degree;
wherein the second surface and third reflective surface forms a second angle of at least 270 degree;
wherein the first and the third reflective surfaces are configured to direct light from the light source to a substantially forward direction; and
wherein the second reflective surface is configured to direct light from the light source in a direction substantially opposite to the forward direction.

19. The lighting device of claim 12, wherein a portion of the light from packaged LED forms a yellow ring, and wherein each of the first and the second angle is selected to reduce the yellow ring otherwise emitted from the lighting device.

20. The method of claim 18, wherein the light emitted from the light source forms a yellow ring and the method further comprises the step of selecting the first angle and the second angle to reduce the yellow ring otherwise emitted from the lighting device.

* * * * *